United States Patent [19]

Keller

[11] Patent Number: 4,630,513

[45] Date of Patent: Dec. 23, 1986

[54] AUTOMATIC DIP TRIMMER APPARATUS

[76] Inventor: Ernst Keller, 259 Leota Ave., Sunnyvale, Calif. 94086

[21] Appl. No.: 701,409

[22] Filed: Feb. 14, 1985

[51] Int. Cl.⁴ ............................................ B23D 33/02
[52] U.S. Cl. ........................................... 83/152; 83/99; 83/167; 83/409.2; 83/580; 83/925 R; 29/566.3
[58] Field of Search ................ 83/99, 167, 409.2, 580, 83/925 R, 152; 29/566.3; 140/139

[56] References Cited

U.S. PATENT DOCUMENTS 4,399,610  8/1983  Moyer ........................... 29/566.3 X
4,539,878  9/1985  Linker et al. ......................... 83/99

Primary Examiner—Donald R. Schran
Attorney, Agent, or Firm—Hamrick, Hoffman, Guillot & Kazubowski

[57] ABSTRACT

An improved DIP lead trimming apparatus including a base having an inclined upper surface which supports an input rail, an output rail, a singulator mechanism, an adaptable cutter assembly and stop assembly, and a DIP lifter assembly for lifting a trimmed DIP from a position above the cutter assembly to the output rail.

18 Claims, 9 Drawing Figures

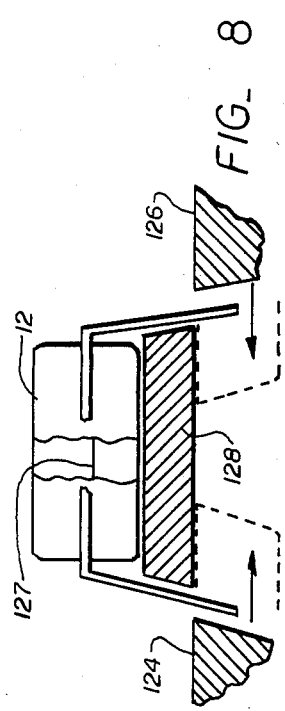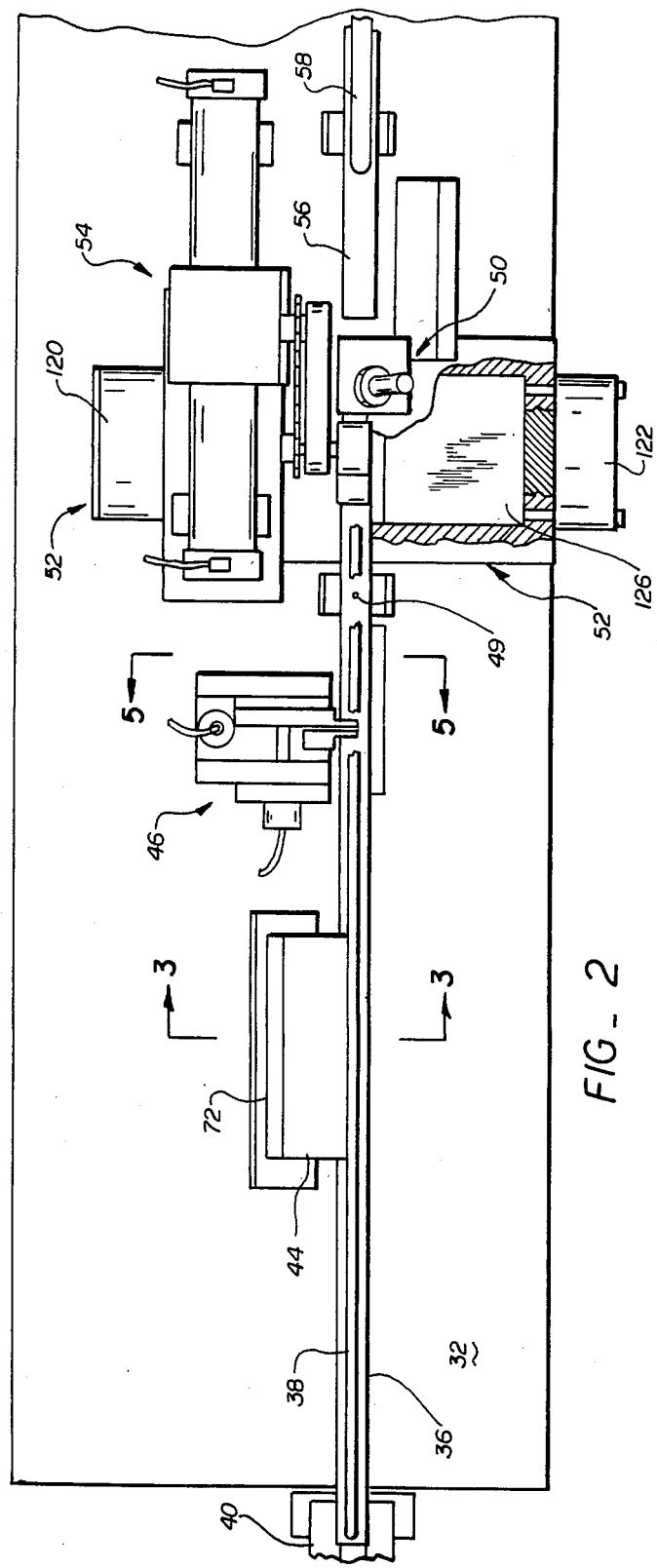

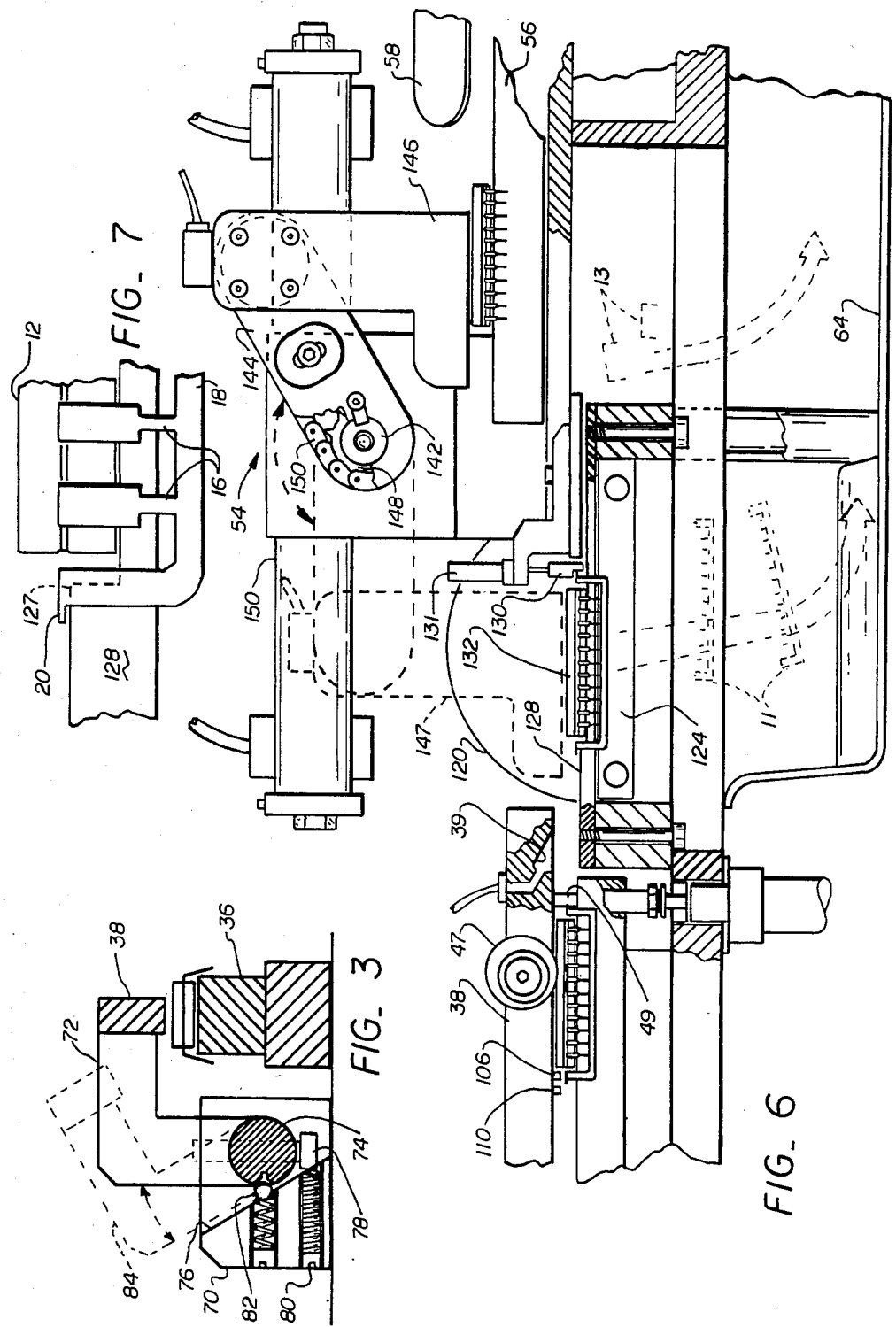

AUTOMATIC DIP TRIMMER APPARATUS

BACKGROUND OF THE INVENTION

1. Field of the Invention

The present invention relates generally to dual in-line packaged (DIP) lead trimming apparatus and more particurlarly to an improved automatic DIP lead trimmer for trimming the leads from a Cerdip DIP package.

2. Description of the Prior Art

Although many automatic DIP lead trimmer devices are known in the prior art, a problem has arisen with regard to prior art devices when they are used to trim the lead frames from Cerdip (an abreviation for "ceramic DIP") packaged electronic chips. The problem relates to the failure of such prior art designs to properly seperate the fore and aft ends of the lead frame scrap from the trimmed DIP. As a result, one or both of the trimmed end portions of the lead frame are often carried with the DIP onto an exit rail and/or into a storage tube causing the DIP legs to bind on the chute or in the storage tube thereby causing jams which must be manually cleared. This of course severely limits the throughput of the device.

SUMMARY OF THE PRESENT INVENTION

It is therefore an object of the present invention to provide an improved lead trimmer for Cerdip type DIPs which is designed to provide positive separation of the trimmed DIP from the scrap lead frame material.

Another object of the present invention is to provide an improved DIP lead trimmer of the type described which is adaptable for use with a wide range of sizes of Cerdip type DIPs.

Briefly, a preferred embodiment of the present invention includes a base having an inclined upper surface which supports an input rail, an output rail, a singulator mechanism, an adaptable cutter assembly and stop assembly, and a DIP lifter assembly for lifting a trimmed DIP from a position above the cutter assembly to the output rail.

An important advantage of the present invention is that it after performing the trimming operation, it momentarily retains the cut end portions of the lead frame in position while the trimmed DIP device is lifted and transported away from the trimming position. The device includes means for subsequently discharging the trimmed lead-ends after the DIP has been removed.

These and other advantages of the present invention will no doubt become apparent to those skilled in the art after having read the following detailed description of a preferred embodiment which is illustrated in the several figures of the drawing.

IN THE DRAWING

FIG. 2 is a top view showing the location of the various component parts of the device shown in the side view in FIG. 1;

FIG. 3 is a cross-section taken along line 3—3 of FIG. 2;

FIG. 6 is an enlarged diagramatic depiction of the deceleration wheel, singulation stop, cutter stop, side cutter and dip lifter components of the present invention; and FIGS. 7 and 8 are exploded views of a portion of the cutter insert plate showing the manner in which the trailing end of the DIP frame is supported on the stepped plate.

DETAILED DESCRIPTION OF THE PREFERRED EMBODIMENT

Figure 1:
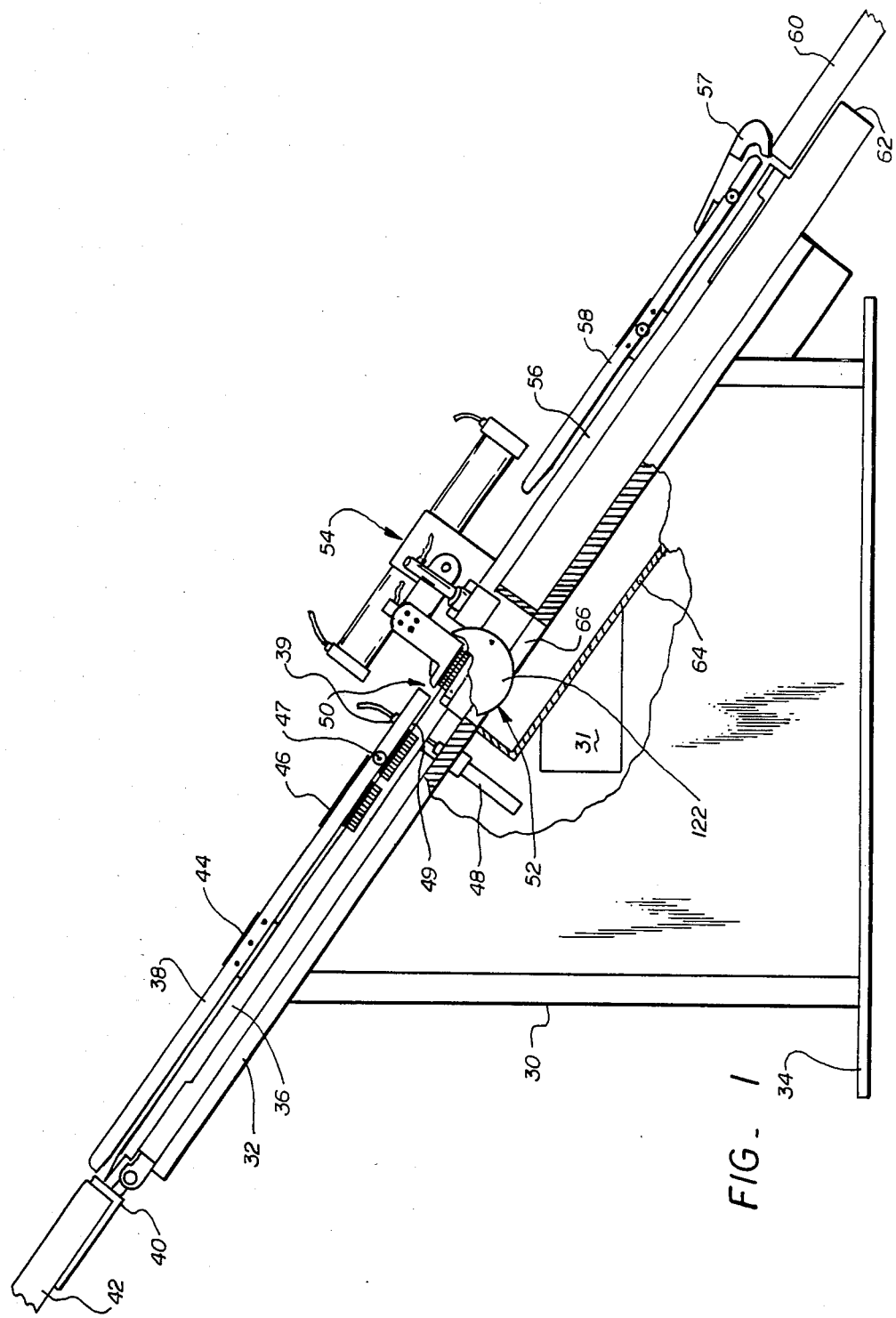
FIG. 1 is a side elevational view of a DIP lead trimmer device in accordance with the present invention.
Figure 1A:
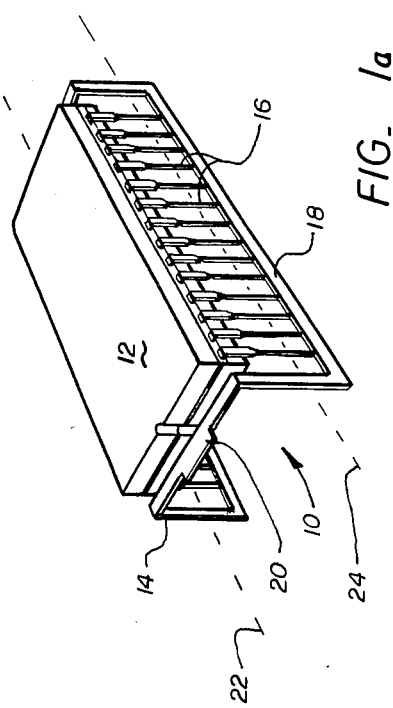
FIG. 1a is a perspective view showing a Cerdip type DIP of the type to be trimmed by the present invention.

In FIG. 1a an untrimmed Cerdip type DIP is shown at 10 to include a body 12 of ceramic or other known material and a downwardly deformed lead frame 14. As depicted, the exposed portions of lead frame 14 consist of a plurality of lead legs 16 and a circumscribing perimeter band 18 formed integral within the lower extremeties of the legs 16. Note that each end of the frame 14 includes an outwardly extending tab 20. One of the last steps in the manufacture of the DIP is to trim the lead frame generally along the dashed lines 22 and 24 causing the perimeter band 18 to fall away in four pieces. However, as alluded to above, if prior art trimming apparatus is used, the U-shaped end portions including the tabs 20 often either follow (or precede) the DIP into the output storage tube or become engaged with the DIP in such a manner as to ride it into the storage tube. In either case, the presence of the lead frame scrap is undesirable as indicated above.

Referring now to FIGS. 1 and 2 of the drawing, side and top views respectively, of a preferred embodiment of an improved automatic DIP lead trimmer in accordance with the present invention are depicted. As shown, the device includes a base and cabinet structure 30 which encloses the pneumatic and electronic control mechanisms represented generally by the number 31 and used to actuate the apparatus. It also provides storage for substitute parts, components etc. The top of the cabinet is formed by a plate 32 which is inclined at an angle relative to a horizontal base plate 34 and provides a support surface to which the various functional components of the apparatus are affixed.

Visable in these views in an input rail 36 and capture bar 38 together with an adjustable bracket 40 for receiving an input tube 42. Also depicted generally is a capture bar bracket 44, a singulatorseparator mechanism 46 and stop mechanism 48, a trim positioning assembly shown generally at 50, a cutter assembly 52, a lift and transport assembly 54, an output rail 56, and an associated capture bar assembly 58. Means for receiving an exit storage tube 60 is shown at 62. It will be appreciated that input and output turret mechanisms could also be used to accommodate multiple tubes.

Also shown affixed to the bottom of plate 32 is a lead scrap receiving chute 64 which communicates with the cutter assembly through an opening 66 in plate 32 as will be further described below.

Both rail 36 and rail 56 have a transverse width suitable for receiving the DIPs, and have a height sufficient to transport DIPs along their lengths without interference.

As is more clearly shown in FIG. 3, capture bar 38 is pivotally mounted above rail 36 by means of a support bracket 44 which includes a base 70 and an upstanding arm 72 pivotally mounted relative thereto by means of a pivot pin 74. Note that base 70 includes a sloped surface 76 that provides a limit stop for arm 72. Arm 72 is affixed to pin 74 by means of a pair of screws, the head of one being shown at 78. Vertical adjustment of rail 38 is accomplished by the adjustment of a set screw 80, the end of which engages screw head 78. Rail 38 is normally held in the illustrated position by a spring loaded ball and detent means shown at 82, but may be rotated away from the illustrated position into the retracted position shown by the dashed lines 84. This adjustment feature enables the separation between the capture bar and the rail top to be selected to accomodate a particular size of DIP package.

Returning to FIG. 1, affixed to bar 38 at a position near its downstream end is a DIP decelerator wheel 47 which is essentially a loosely attached washer or eccentric wheel that extends down into the path of the DIPs so as to be engaged thereby to absorb a portion of their sliding energy before they reach a lower metering stop 49, the operational position of which is controlled by the pneumatic actuator 48 disposed beneath the upper surface of plate 32.

Also shown in FIG. 1 at the downsteam end of capture bar 38 is a scrap ejection blower port 39 (see also FIG. 6), the use of which will be described below.

Figure 4:
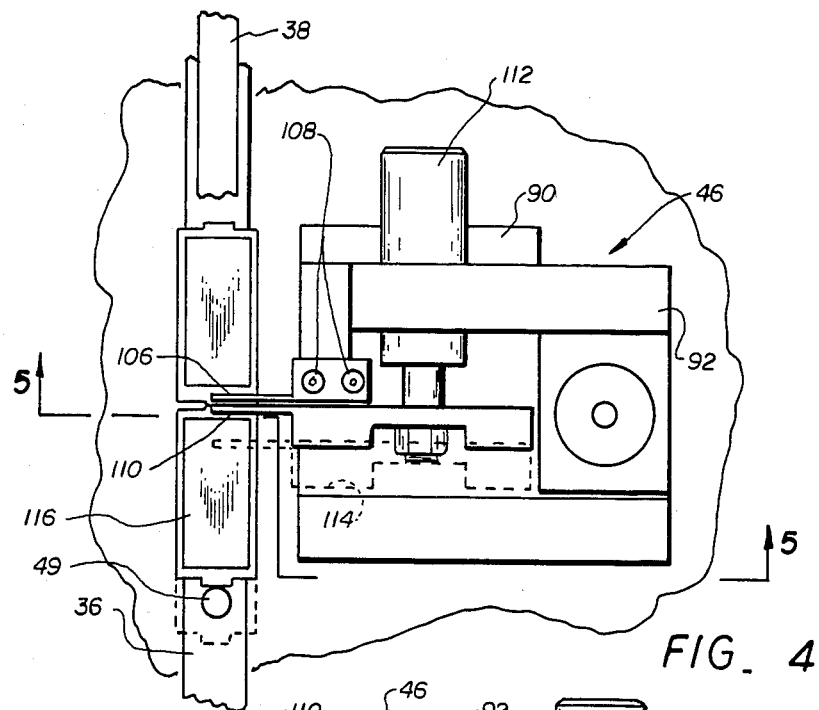
FIG. 4 is a partially broken top view more specifically depicting the singulator-separator subassembly shown in FIG. 2.
Figure 5:
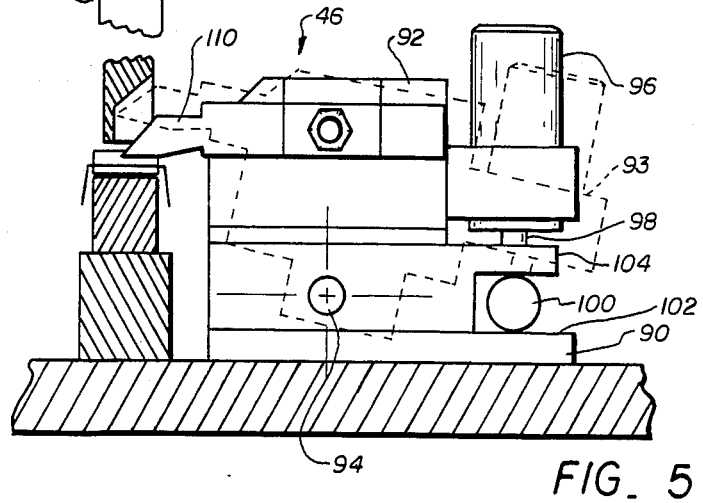
FIG. 5 is a cross-section taken along the line 5—5 in FIG. 2 showing the singulator-separator device of FIG. 4.

Turning to FIGS. 4 and 5 of the drawing, the details of the singulator-separator mechanism 46 will be described. As illustrated, the device includes a base 90 to which a blade support block 92 is pivotally attached by means of a shaft 94. The block 92 is selectively rotated about shaft 94 (FIG. 5) by means of a pneumatic actuator 96 attached to its rightmost extremity. Actuator 96 has an actuator arm 98 and a pin 100 which fits into a slot 102 formed beneath a projection 104 of base 90 to permit rotation of block 92 relative to the base as shown by the dashed lines 93.

A first singulator blade 106 is rigidly affixed to block 92 by means of set screws, or the like, as shown at 108. A movable separator blade 110 is disposed parallel to the singulator blade 106 but is separably moveable away from blade 106 by means of an actuator 112 that is carried by block 92.

As indicated in FIG. 4 by the dashed lines 114, actuation of the separator cylinder 112 causes the blade 110 to engage the rear end of a DIP 116 initially held in position by the lower stop 49 to urge it on its way in the event that it does not move quickly down the rail 36 after the lower stop 49 is retracted. After the DIP has cleared the end of rail 36 and stop 49 has been raised to its upper position, blade 110 is retracted and cylinder 96 (FIG. 5) is actuated to rotate blade 92 and carry both blades 106 and 110 upwardly to allow a second DIP to pass therebeneath and move into position against stop 49. The blades are then rotated back into the position shown by the solid lines in FIG. 5 and between the next two DIPs as shown in FIG. 4.

Referring to FIG. 6, it will be seen that disposed slightly downstream of and beneath the lower end of capture bar 38 is a pair of cutter bar assemblies respectively disposed on each side of the centerline of rail 38 and including a pair of pneumatic actuators 120 and 122 (FIG. 2), and an associated pair of cutter bars 124 (FIG. 6) and 126 (FIG. 2) which are driven toward each other beneath a stepped cutter rail insert 128 which cooperates therewith to trim the lower portions of the DIP lead frames.

A neumatically actuated stop device 130, which in combination with the insert 128 forms the aforementioned trim positioning assembly, is positioned on the downstream side of the cutter bar assembly, and serves to provide a stop for positioning a DIP 12 to be trimmed.

The insert 128 has a stepped upper surface, the step 129 (see also FIG. 7) of which is dimensioned so as to correspond to the separation between the bottom of the DIP package and the bottom of the horizontal tab portion 20 of the lead frame 18. Moreover, the shoulder 127 is positioned relative to the stop 130 assembly such that when the DIP 12 is stopped in position above the cutter assembly its trailing lead frame tab will rest upon the shoulder 127 as shown in FIG. 7. The cutter stop 130 is actuatable from the illustrated lower position, in which it serves as a stop for engagement by the leading edge of the DIP lead frame, and an upper position into which it is drawn by the pneumatic actuator 131 in order to insure discharge of the scrap lead frame end.

The DIP lift and transport assembly includes a bidirectional rotary actuator mechanism 140 having a rack (not shown) for engaging the pinion shaft 142 of a rotary arm 144 having a vacuum lifter chuck 146 pivotally attached to its distal end. A first fixed sprocket 148 is mounted about the pinion shaft 142, and a second sprocket (not shown) is fixedly secured to the lift chuck 146. The two sprockets are coupled together by means of a chain 150 which, as is well understood in the art, functions to maintain chuck 146 in the vertically disposed position illustrated in the drawing as it is moved from the DIP lifting position shown by the dashed lines 147 to the DIP discharge position shown at 146. Vacuum is suplied to openings in the sole or lower portion of the chuck 142 upon mating with the top surface of the DIP to establish an engagement which permits the DIP to be lifted and transported to the output rail 56 at which time the vacuum is turned off and the DIP is allowed to slide down the rail.

In operation, it will be appreciated that after the cutters 124 and 126 have passed beneath the cutting plate 128 as depicted in FIG. 8 severing the lower portions of the lead frame and causing them to fall into chute 64 as indicated at 11, and the DIP has been removed by the vacuum chuck, the end portions of the lead frames will temporarily remain in position about plate 128 as their severed ends rest upon the tops of the cutter blades 124 and 126. However, upon the lifting of stop 130, by actuation of actuator 131, and by the application of a blast of air through the oriface 39 the two end portions, sometimes referred to as "clips" will be caused to slide down the plate 128 and fall into the chute 64 as indicated by the dashed lines 13 for discharge into a suitable receptacle (not shown). The stop 130 will then immediately be lowered, stop 49 will be lowered, singulator-separator 46 will be actuated, and a new DIP will be caused to slide into the cutting position. Chuck 46 will then rotate into engagement with the top surface thereof and the trimming cycle will be repeated.

Although not specifically shown, it will be appreciated that several suitable DIP passage or presence detectors are strategically located along the DIP path to assist the automatic control mechanism in performing its operation. Furthermore, it will be appreciated that by simply replacing the cutter insert plate 128 with a different plate other sizes of DIPs can be trimmed with the device.

Whereas the present invention has been disclosed above with regard to a single preferred embodiment, it will be appreciated that after having read the above disclosure, it is likely that those skilled in the art may choose to make certain alterations and modifications. It is therefore intended that the following claims be interpreted as covering all such alterations and modifications as fall within the true spirit and scope of the invention.

What is claimed is:

1. An improved lead frame trimmer apparatus for trimming Cerdip type DIP devices having a lead frame that extends fore and aft of the ends of the device terminating in horizontal tabs or the like, comprising:
    means forming an inclined input rail for receiving untrimmed DIP devices;
    means forming an inclined output rail for receiving trimmed DIP devices, said output rail being separated from said input rail;
    lead trimming cutter means disposed between said input rail and said output rail and including insert means for positioning a DIP device to be trimmed such that one of said tabs engages a first stop and the other rests upon a support surface forming a part of said insert means;
    singulating and separating means disposed between said input rail and said cutter means for admitting DIPs one at a time to said cutter means; and
    lift means for engaging a trimmed DIP disposed in said cutter means, lifting it from said input rail, and transporting it to said output rail.

2. An improved lead frame trimmer apparatus as recited in claim 1 wherein said insert means is a narrow plate having cutting edges along its bottom surface, and wherein said cutter means includes a pair of cutter plates respectively disposed on opposite sides of said insert means and adapted to pass beneath said insert means and to cooperate with said cutting edges to trim the lead frame of a DIP disposed thereupon.

3. An improved lead frame trimmer apparatus as recited in claim 2 wherein said singulating and separating means includes a second stop removably disposed at the downstream end of said input rail for engagement with the downstream end of a first DIP disposed on said input rail, and first blade means disposed upstream of said second stop and operative to be selectively moved into and out of a position between the other end of said first DIP and the adjacent end of a second DIP.

4. An improved lead frame trimmer apparatus as recited in claim 3 and further including means for directing a flow of air into said cutter means to discharge scrap trimmed from a DIP.

5. An improved lead frame trimmer apparatus as recited in claim 1 wherein said lift means includes a vacuum chuck and means for moving said chuck between a DIP engaging position proximate said cutter means and a DIP discharging position proximate said output rail.

6. An improved lead frame trimmer apparatus as recited in claim 5 wherein said means for moving includes a rotary actuator means.

7. An improved lead frame trimmer apparatus as recited in claim 3 wherein said singulating and separting means includes a second blade means and means for driving same into engagement with said first DIP to urge it to move from said input rail to said cutter means.

8. An improved lead frame trimmer apparatus as recited in claim 4 and further comprising scrap discharge chute means disposed beneath said cutter means to collect the lead frame material trimmed from a DIP device.

9. An improved lead frame trimmer apparatus as recited in claim 1 wherein said singulating and separating means includes a second stop removably disposed at the downstream end of said input rail for engagement with the downstream end of a first DIP disposed on said input rail, and first blade means disposed upstream of said second stop and operative to be selectively moved into and out of a position between the other end of said first DIP and the adjacent end of a second DIP.

10. An improved lead frame trimmer apparatus as recited in claim 5 wherein said insert means is a narrow plate having cutting edges along its bottom surface, and wherein said cutter means includes a pair of cutter plates respectively disposed on opposite sides of said insert means and adapted to pass beneath said insert means and to cooperate with said cutting edges to trim the lead frame of a DIP disposed thereupon.

11. An improved lead frame trimmer apparatus as recited in claim 1 wherein said insert means includes an elongated cutter rail having a downward step formed in its upper surface proximate the end nearest said input rail, the shoulder of said step forming said support surface, said cutter rail cooperating with said first stop to form a nest for receiving an untrimmed DIP.

12. An improved lead frame trimmer apparatus as recited in claim 2 wherein the upper surface of said insert means forms an elongated rail having a downward step provided therein proximate the end nearest said input rail, the shoulder of said step forming said support surface, said rail cooperating with said first stop to form a nest for receiving an untrimmed DIP.

13. An improved lead frame trimmer apparatus as recited in claim 12 wherein said singulating and separating means includes a second stop removably disposed at the downstream end of said input rail for engagement with the downstream end of a first DIP disposed on said input rail, and first blade means disposed upstream of said second stop and operative to be selectively moved into and out of a position between the other end of said first DIP and the adjacent end of a second DIP.

14. An improved lead frame trimmer apparatus as recited in claim 13 and further including means for directing a flow of air into said cutter means to discharge scrap trimmed from a DIP.

15. An improved lead frame trimmer apparatus as recited in claim 14 wherein said lift means includes a vacuum chuck and means for moving said chuck between a DIP engaging position proximate said cutter means and a DIP discharging position proximate said output rail.

16. An improved lead frame trimmer apparatus as recited in claim 15 wherein said means for moving includes a rotary actuator means comprising a pneumatically actuated rack and pinion means, an elongated rotary arm pivotally connected to a base, a first sprocket carried by one end of said arm and driven by said pinion means, a second sprocket carried by the other end of said arm and coupled to said first sprocket by a drive chain, and a foot means coupled to said second sprocket and adapted to carry said vacuum chuck.

17. An improved lead frame trimmer apparatus as recited in claim 16 wherein said singulating and separating means includes a second blade means and means for driving same into engagement with said first DIP to urge it to move from said input rail to said cutter means.

18. An improved lead frame trimmer apparatus as recited in claim 17 and further comprising scrap discharge chute means disposed beneath said cutter means to collect the lead frame material trimmed from a DIP device.

* * * * *